United States Patent [19]

Younger et al.

[11] Patent Number: 5,202,283
[45] Date of Patent: Apr. 13, 1993

[54] TECHNIQUE FOR DOPING MOCVD GROWN CRYSTALLINE MATERIALS USING FREE RADICAL TRANSPORT OF THE DOPANT SPECIES

[75] Inventors: Charles R. Younger, Anaheim Hills; Kenneth L. Hess, Yorba Linda; Stuart J. C. Irvine, Moorpark; Edward R. Gertner, Moorpark; Shawn L. Johnston, Moorpark, all of Calif.

[73] Assignee: Rockwell International Corporation, Seal Beach, Calif.

[21] Appl. No.: 656,940

[22] Filed: Feb. 19, 1991

[51] Int. Cl.⁵ .................. H01L 21/20; H01L 21/36
[52] U.S. Cl. ...................... 437/81; 437/167; 437/168; 437/102; 437/104; 437/965; 156/605; 148/DIG. 110
[58] Field of Search ............... 437/81, 167, 168, 102, 437/104, 965; 156/605; 148/DIG. 31, DIG. 110

[56] References Cited

U.S. PATENT DOCUMENTS

| | | |
|---|---|---|
| 3,218,203 | 11/1965 | Ruehrwein ..................... 156/606 |
| 3,249,473 | 5/1966 | Holonyak, Jr. ................ 156/606 |
| 3,657,004 | 4/1972 | Merkel et al. ................. 156/606 |
| 3,901,746 | 8/1975 | Boucher ........................ 156/606 |
| 4,368,098 | 11/1983 | Manasevit . |
| 4,404,265 | 9/1983 | Manasevit . |
| 4,566,918 | 1/1986 | Irvine et al. . |
| 4,650,539 | 3/1987 | Irvine et al. . |
| 4,782,034 | 11/1988 | Dentai et al. ................. 437/104 |
| 4,904,337 | 2/1990 | Elliott et al. ................. 156/610 |
| 4,904,616 | 2/1990 | Bohline et al. ................ 437/81 |

FOREIGN PATENT DOCUMENTS

| | | | |
|---|---|---|---|
| 0121919 | 7/1984 | Japan ........................ 156/606 |
| 0022024 | 1/1989 | Japan ........................ 437/104 |
| 2193228 | 2/1988 | United Kingdom ........... 437/104 |

Primary Examiner—Brian E. Hearn
Assistant Examiner—Trune Dang
Attorney, Agent, or Firm—H. Fredrick Hamann; George A. Montanye; Wilfred G. Caldwell

[57] ABSTRACT

Method for organic free radical, including aliphatic radical, transport of dopant species for precise, predetermined, and reproducible doping concentrations to control electrical properties for chemical vapor deposition grown materials.

36 Claims, 11 Drawing Sheets

TECHNIQUE FOR DOPING MOCVD GROWN CRYSTALLINE MATERIALS USING FREE RADICAL TRANSPORT OF THE DOPANT SPECIES

This application is related to U.S. Ser. No. 07/657,692 concurrently filed by Younger et al. entitled TECHNIQUE FOR DOPING MERCURY CADMIUM TELLURIDE MOCVD GROWN CRYSTALLINE MATERIALS USING FREE RADICAL TRANSPORT OF ELEMENTAL INDIUM AND APPARATUS THEREFOR and assigned to a common assignee.

BACKGROUND OF THE INVENTION

1. Field of the Invention

The invention relates, in general, to semiconductor fabrication using metalorganic chemical vapor deposition crystal growth, and more particularly to vapor phase transport of a dopant species by organic free radicals, preferably aliphatic radicals such as methyl, ethyl, or n-propyl, for controlled doping in a reproducible manner.

2. Prior Art

The Manasevit U.S. Pat. Nos. 4,368,098 and 4,404,265 describe methods and apparatus for growing thin film single crystal Group III-V wide band-gap compound semiconductors, wherein the thin film may be produced in situ on a heated substrate in an MOCVD reactor by reaction of an organic compound containing a Group III constituent with a Group V hydride. These patents are assigned to a common assignee of the present application, and techniques disclosed in the patents are used in the present invention.

In the manufacturing of electrically active single crystal semiconductor materials by metalorganic chemical vapor deposition (MOCVD), precise control over the carrier concentration in the materials is essential. A common way to control carrier type and concentration is by intentionally doping the material during growth with a dopant species which will provide the correct carrier type at the desired concentration in the crystalline material.

The problem which has existed with present doping schemes in MOCVD growth is a lack of precise control and reproducibility at low dopant concentrations. One of these schemes which exhibits problematic behavior is alkyl-doping. This is where the dopant species is introduced in the form of a presynthesized metalorganic chemical, and is subsequently decomposed in the growth zone of the crystal growth reaction chamber by heat energy which emanates from a localized heat source, as in the Manasevit patents (supra). The dopant flux in this arrangement is controlled by the partial pressure of the metalorganic compound in the gas phase. The partial pressure is established by the concentration of metalorganic compound in the vapor transporting the compound as a diluent gas, hydrogen, through a network of stainless steel tubing which interconnects the chemical source and the reaction chamber. One problem that occurs with this configuration is the intolerable decay of dopant levels due to condensation, and/or adsorption/desorption processes, of the metalorganic chemicals in the transport lines. This is commonly referred to as the "memory effect." It is this memory effect which complicates the issue of fabricating abrupt transitions in electrically active dopant species. This memory effect phenomena may require numerous growth runs, in which the dopant species is not introduced, for the dopant concentration to fall below deleterious levels.

SUMMARY OF THE INVENTION

The present invention uses free organic radicals, preferably aliphatic or alkyl radicals to transport the active dopant species in the vapor phase to the semiconductor being grown. These radicals are a byproduct of the normal decomposition of the primary alkyl constituents used in crystal growth by MOCVD. This technique, referred to as "free radical doping," uses a low-mass elemental dopant source target, in proximity to the growth substrate. A localized heat source (RF, infrared, laser, etc.) collectively elevates the temperatures of the substrate and dopant target, both of which are mounted on a heated block in the reactor, and it is the heat from this block that causes the desired chemical reactions to take place in the reactor. The block may comprise a graphite susceptor for holding the substrate and the heat from the susceptor, causes the free organic radicals to react with the dopant source target for a temporary transient synthesis of a reactive metalorganic species. This reactive species is then transported in the vapor phase to the substrate where surface decomposition releases the elemental dopant species for incorporation into the growing semiconductor material.

In an alternative embodiment, separate blocks of graphite are used to carry the substrate and the dopant source, and each is heated by a different heating source. Separate heat control enables adjustment of the amount of heat applied to the dopant target source to control the dopant concentration in the semiconductor being formed.

The gas phase dopant flux can be precisely controlled by varying the mass of the dopant source target, the concentration of free radicals for transport, and/or the heat of the indium source.

With this technique there is no run-to-run memory effect or accumulation of dopants, as with prior art type alkyl-doping, and the reproducibility and control of dopant levels is better than any other known technique for in-situ doping during MOCVD growth. A few examples of the finished doped semiconductor include indium doped mercury cadmium telluride, zinc doped gallium arsenide, and beryllium doped indium phosphide. Thus, one product application of the MOCVD grown mercury cadmium telluride invention is for use in long wave infrared detectors.

BRIEF DESCRIPTION OF THE DRAWINGS

FIGS. 4, 5, and 6 show that the dopant uniformity within this layer is at 11.5%, which is outstanding considering that dopant concentrations are a logarithmic function of dopant input flux;

DETAILED DESCRIPTION OF A PREFERRED EMBODIMENT OF THE INVENTION

FIGS. 1, 2, 3, and 3A diagram one configuration for susceptor doping in carrying out the present invention.

Figure 1:
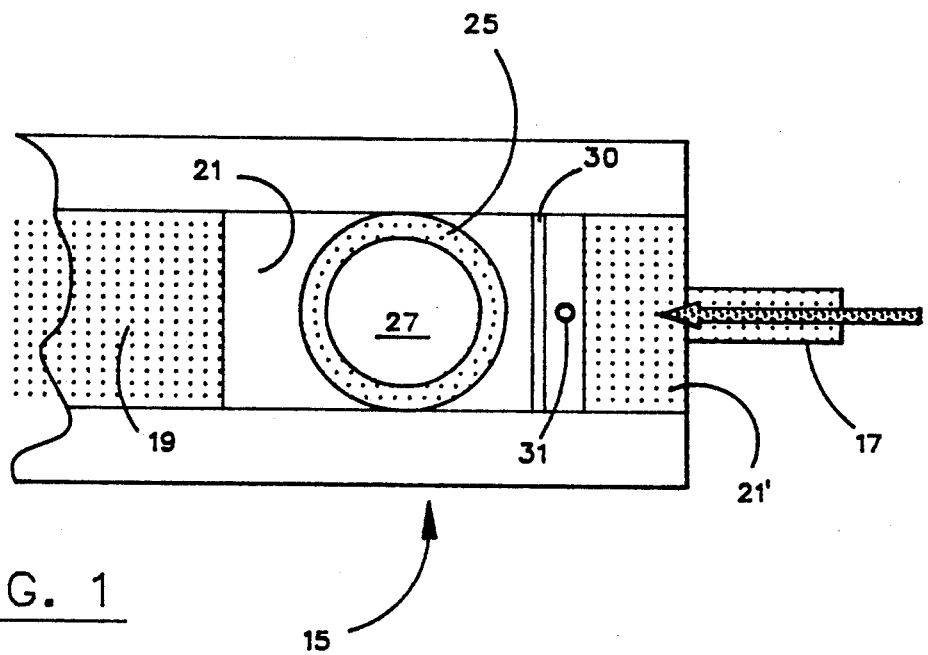
FIG. 1 is a plan view of a portion of a reactor capable of carrying out the present invention.
Figure 2:
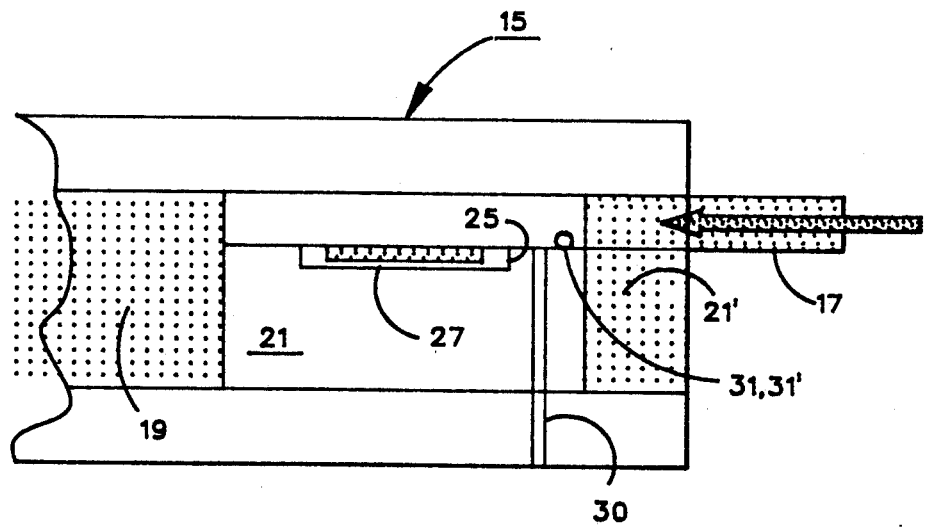
FIG. 2 is a view of the structure of FIG. 1 in side elevation.

In FIG. 1, the open continuous flow reactor pressure vessel is shown at 15 having an inlet 17 for metalorganic reactants with a reactor flow channel 19 extending through and exiting the reactor pressure vessel 15. In the flow channel 19, there is positioned a susceptor 21 which can be an RF heated graphite block. A rotating recessed table 25 is disposed in the upper portion of the graphite block 21 to carry the substrate 27 upon which the semiconductor being doped is formed.

Figure 3:
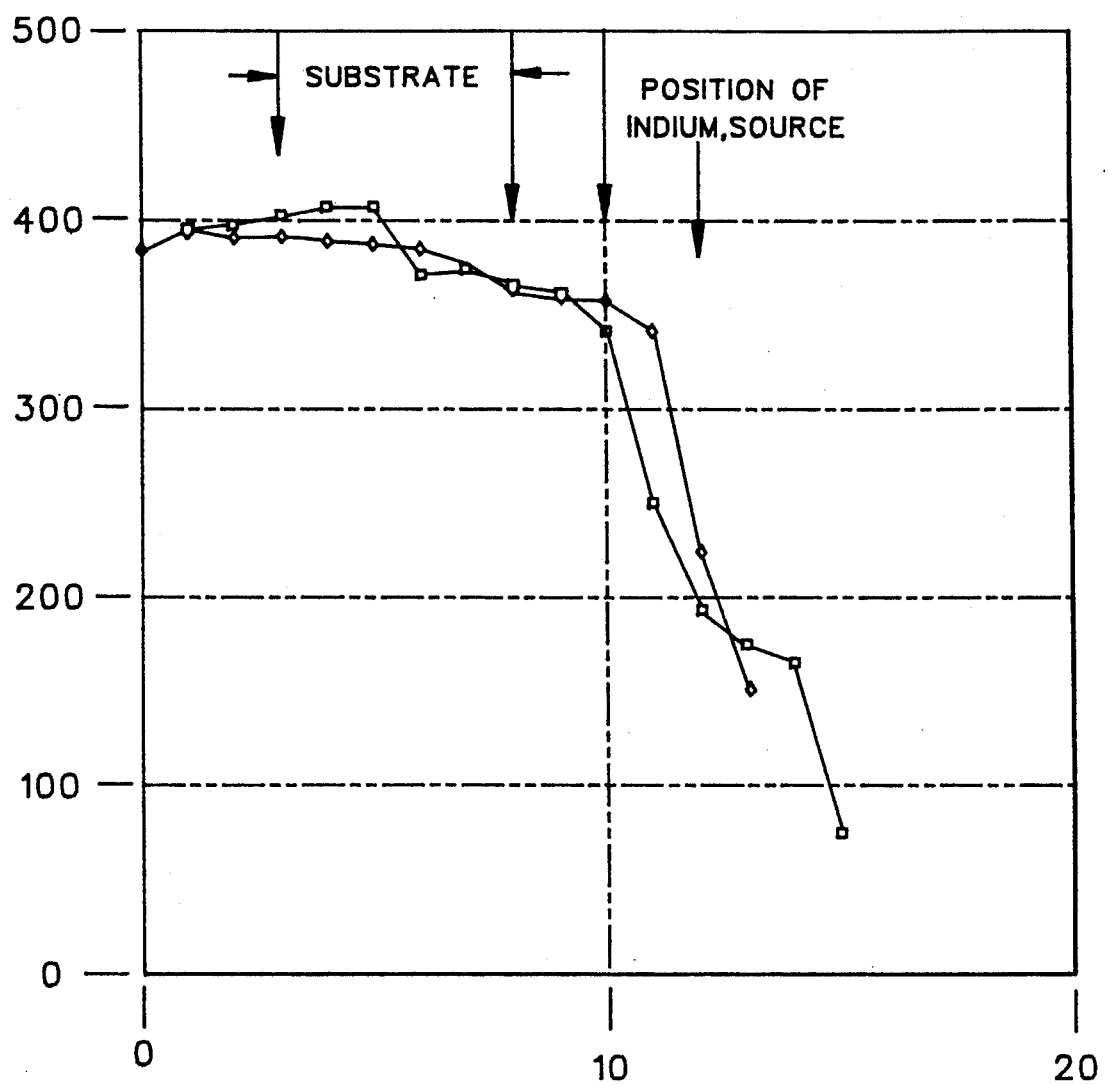
FIG. 3 is a plot of temperature distribution across the reactor relative to the substrate and target source versus separation in centimeters.
Figure 3A:
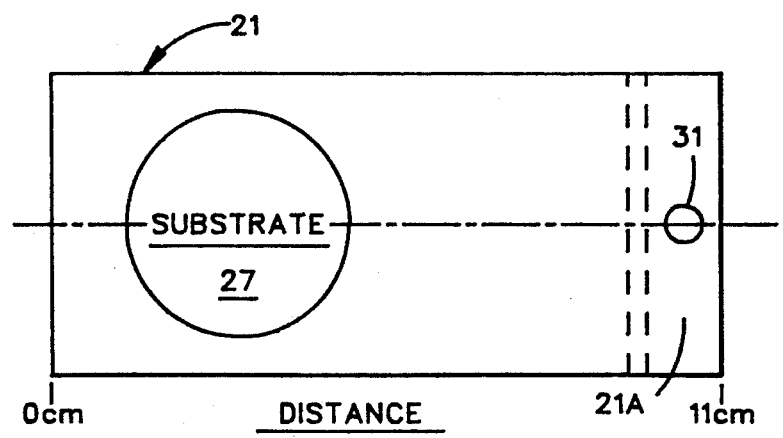
FIG. 3A is a sketch, in plan view, to show the substrate relative to the dopant source, which for one example is indium, and indicate the line along which the temperature profile of FIG. 3 was taken.
Figure 4:
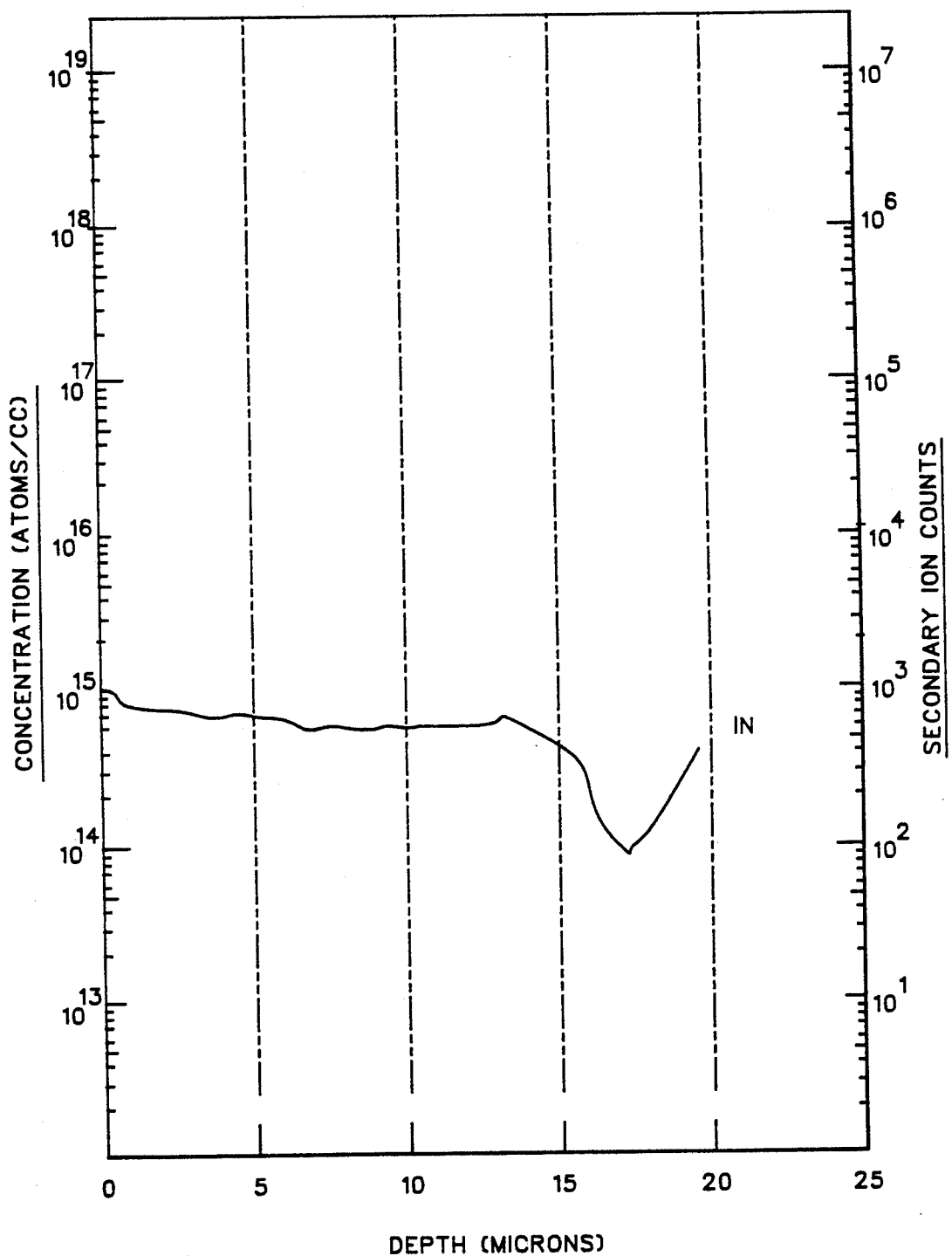
FIG. 4 is a secondary ion mass spectroscopy (SIMS) profile of the dopant species concentration in the semiconductor material, which for this example is mercury cadmium telluride, showing an average concentration of indium dopant at $9 \times 10^{14}$ atoms/cm$^3$, this SIMS data was taken approximately at the center of the wafer.
Figure 5:
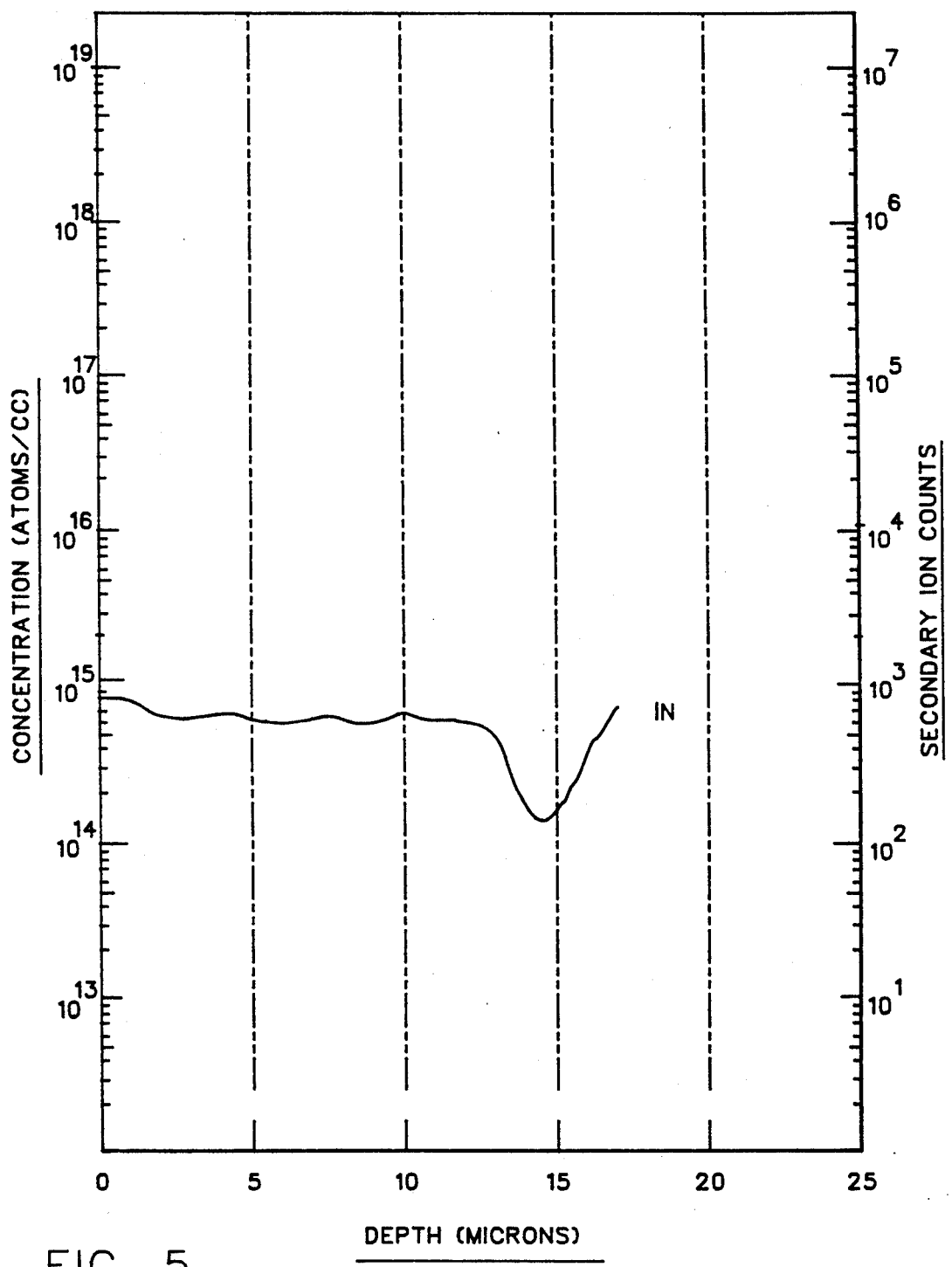
FIG. 5 is a SIMS profile taken from midway between the center and edge of the same 2 inch diameter wafer, with the same measured average dopant density as the center point (FIG. 4)
Figure 6:
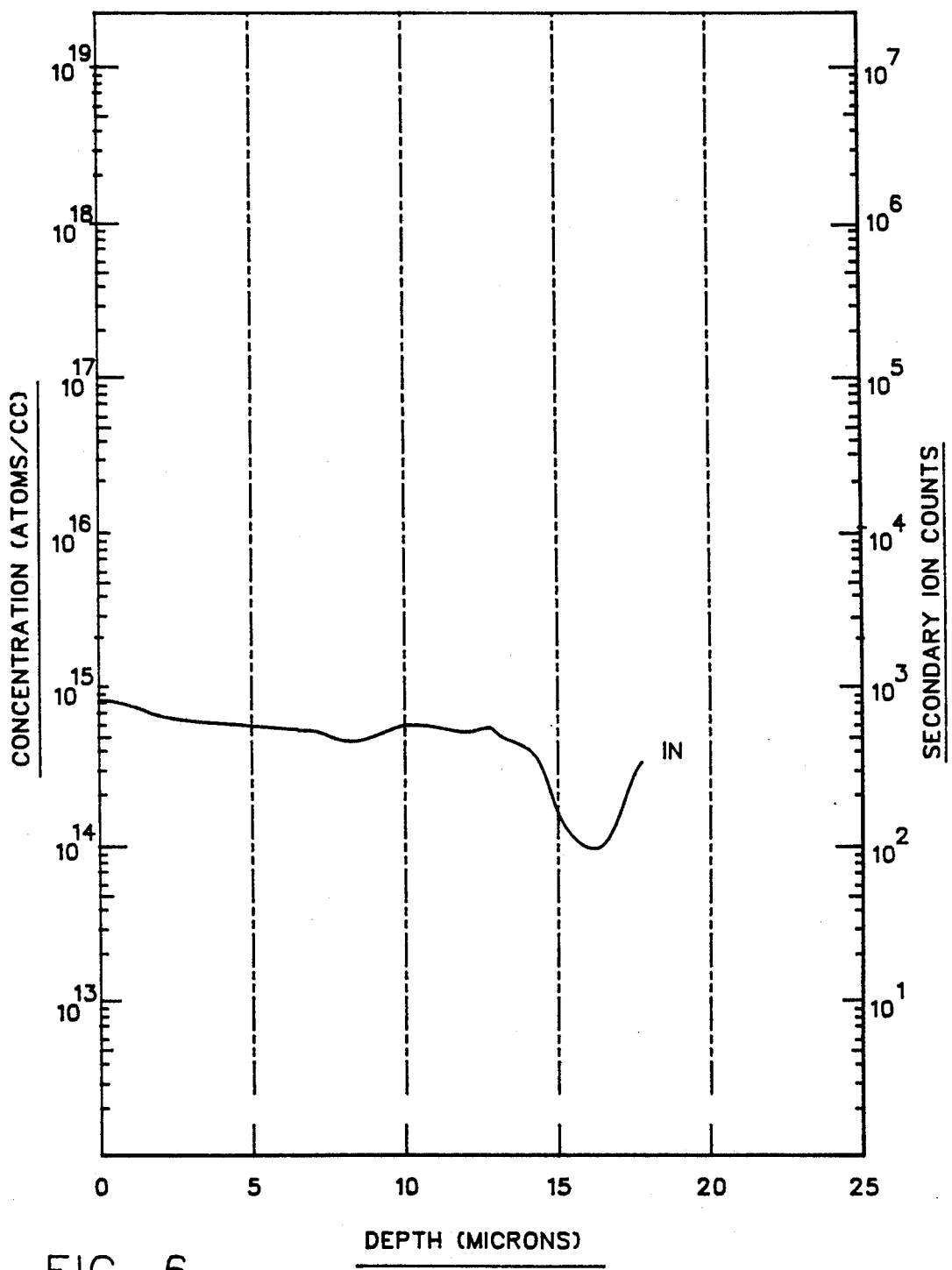
FIG. 6 is a SIMS profile from the edge (0.875 inches from the center of the same wafer, and shows essentially the same average dopant concentration as the midway and center points of the wafer.
Figure 7:
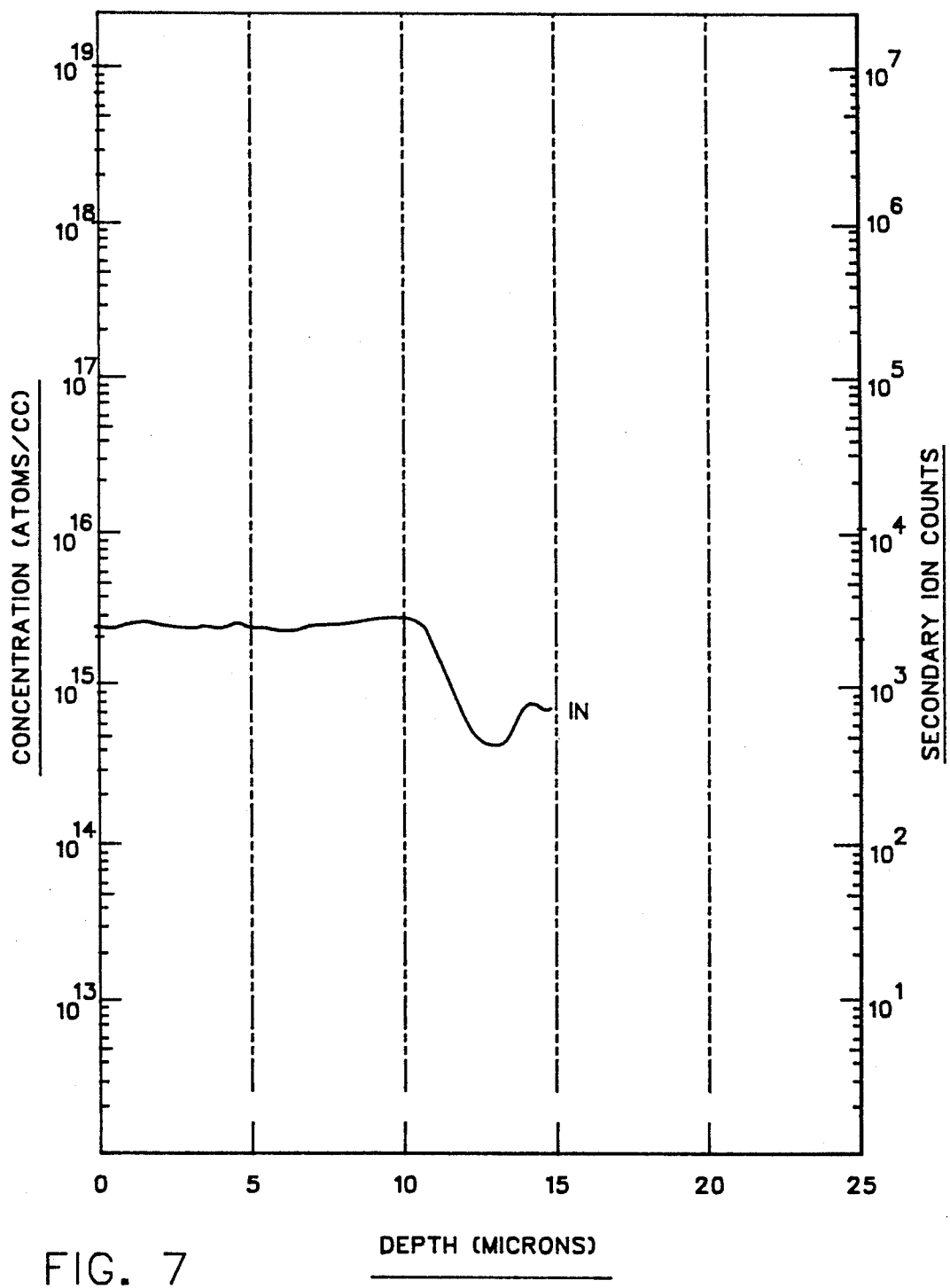
FIGS. 7, 8, and 9 are SIMS profiles of another indium doped mercury cadmium telluride sample and show an average dopant concentration of $\sim 2 \times 10^{15}$ atoms/cm$^3$ and a uniformity of 13.6%.
Figure 8:
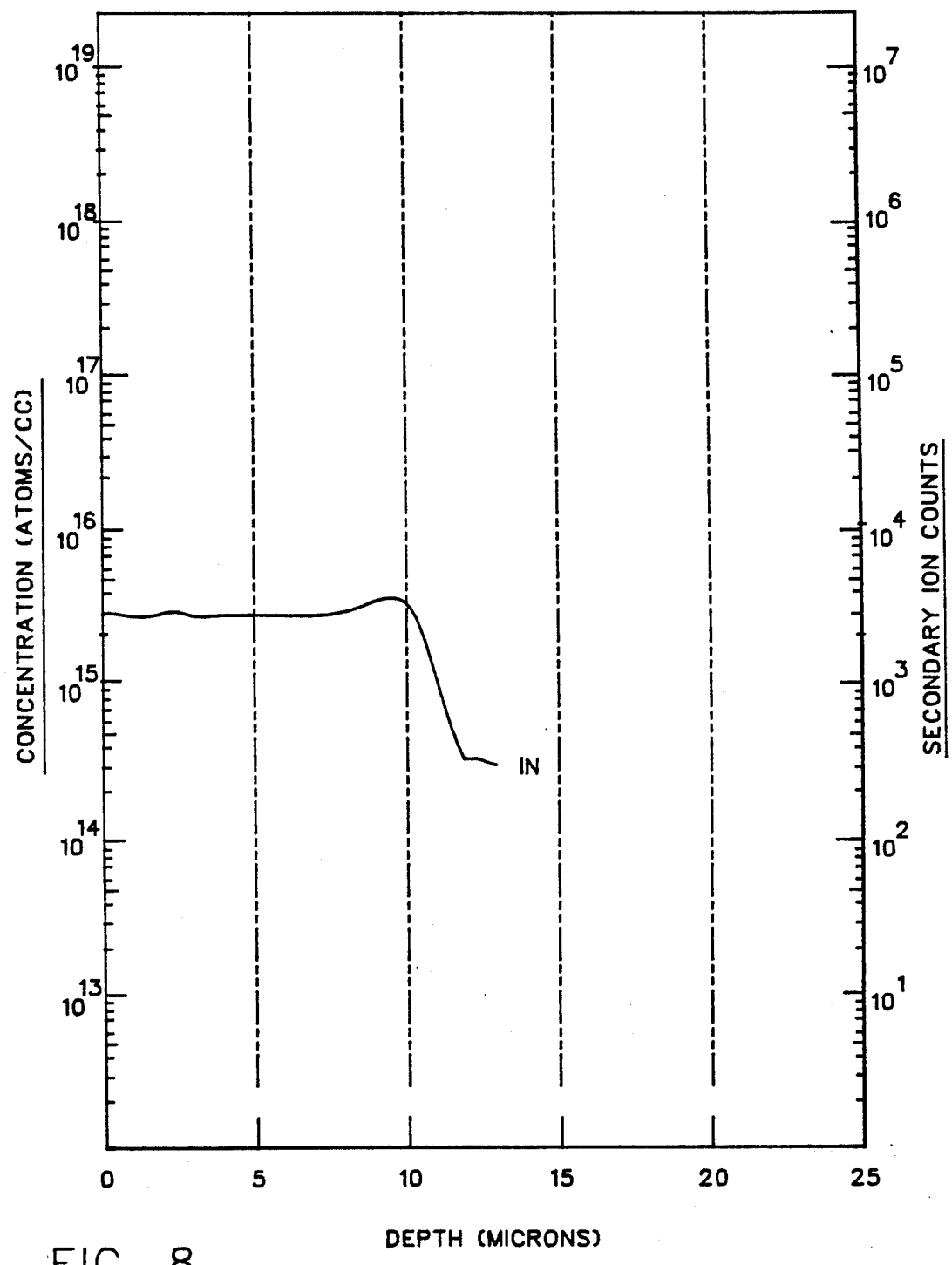
Figure 9:
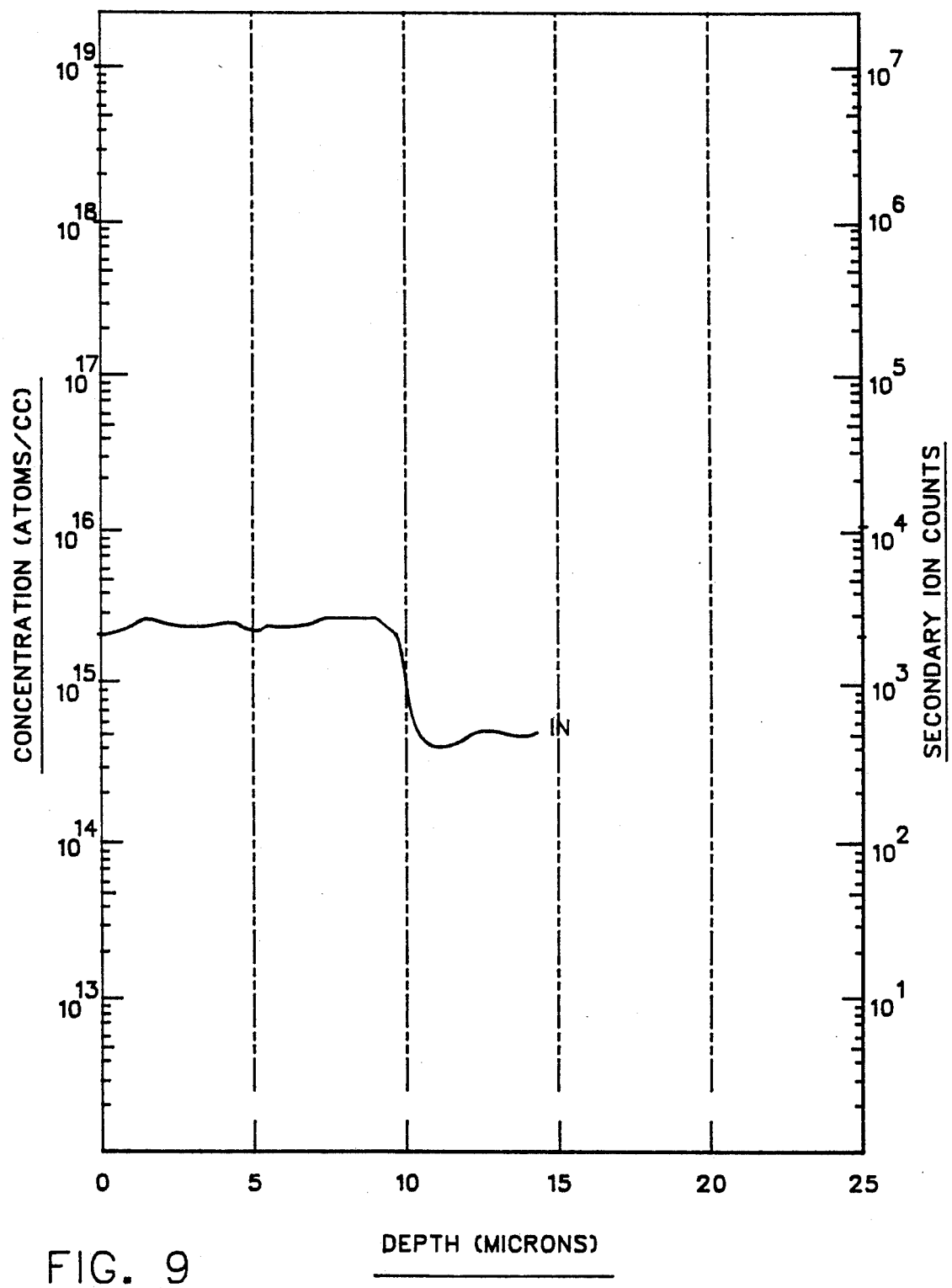

From FIGS. 3 and 3A, it will be seen that, by way of example, the graphite block 21 may be approximately 11 centimeters in length with an indium source 31 being approximately 6 centimeters from the center of the substrate 27. Block 21 is a single block in one embodiment with a single source of heat. However, when it is desired to variably control doping density by controlling the temperature of the source 31, such as for data bits 45 and 47 in FIG. 11, block 21 is separated at 30 and a separate controlled source of heat is applied to the right hand block 21'. The slot 30 is preferably filled with good insulating material so the heating source for block 21' is the predominant control over dopant 31.

From the temperature chart of FIG. 3, it can be seen that the substrate is at approximately 400° C. and the indium source 31 is at about 350° C. as a result of the RF heating of the graphite block or susceptor 21, in the absence of slot 30. Some heat, of course, is conducted across the slot but this amount is always present and is accordingly calibrated into the heat quantity affecting dopant 31'.

MERCURY CADMIUM TELLURIDE, INDIUM DOPED

In a first embodiment, the materials provided at the inlet 17 (FIG. 1) for entering the reactor vessel 15 are:
dimethyl cadmium
dimethyl tellurium
dimethyl zinc
di-isopropyl tellurium flowed through an elemental mercury source, and
a carrier gas of high purity hydrogen.

Also, elemental indium 31 is located on the susceptor 21.

Three basic cycles (depositing layers of zinc telluride, cadmium telluride and alternating layers of cadmium telluride and mercury telluride) are utilized for developing the finished mercury cadmium telluride semiconductor, doped to a predetermined concentration by indium.

Essentially, these basic cycles are carried out in utilizing the interdiffused multilayer process (IMP) to produce mercury cadmium telluride, which is set forth more fully in the prior art as U.S. Pat. Nos. 4,650,539 and 4,566,918, Irvine et al., relating to interdiffused multilayer processing, which are hereby incorporated by reference in so far as applicable.

In the instant invention, precisely controlled doping of all of the layers will be carried out throughout the process, now to be described.

The preferred substrate 27 is gallium arsenide with a crystallographic orientation of $<100> 10° \rightarrow <110>$ (i.e.) with the $<100>$ plane oriented 10 degrees toward the $<110>$ plane. This orientation is selected because of convenience and improved yield, but other orientations can be used for lattice matching. The substrate 27 is purchased from any of several commercial sources with the predetermined orientation.

Figure 12:
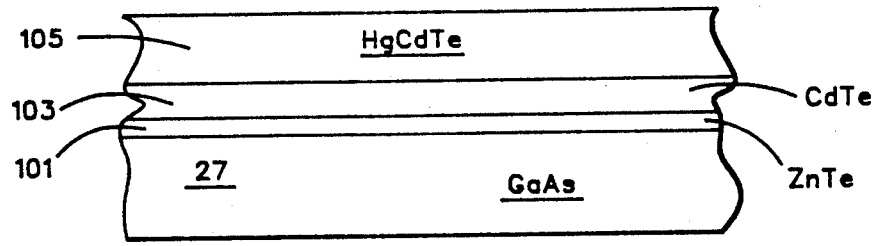
FIG. 12 shows a ternary mercury cadmium telluride semiconductor doped in accordance with a preferred method of the present invention.
Figure 12A:
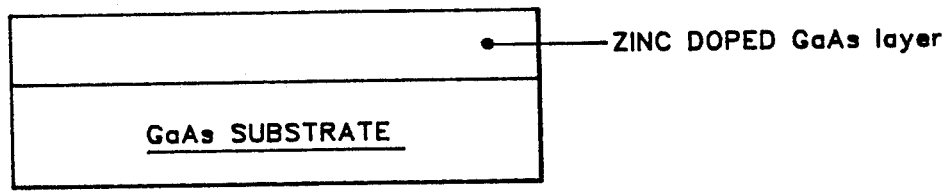
FIGS. 12A and 12B show multi-layer semiconductor material structures doped in accordance with the present invention.
Figure 12B:
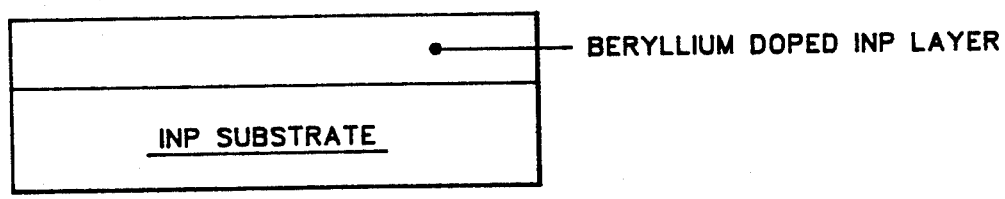

First, a thin layer of zinc telluride 101 (FIG. 12) is laid down on the gallium arsenide substrate 27 of FIG. 1. This is accomplished by entering into inlet 17 of FIG. 1, dimethyl zinc and dimethyl tellurium, using a carrier gas of highly purified hydrogen, with the temperature of the susceptor in the reactor being approximately 400° C. due to the radio frequency heating of the graphite block 21. This creates reactive species, some of which combine into zinc telluride and methyl indium, the indium coming from the commonly heated dopant source target 31. It is known that the vapor pressure of elemental indium at 350° C. is approximately $10^{-11}$ Torr which is extremely small so it does not account for the indium doping or transport that is obtained by this process. Thus, it is believed that the methyl radicals transport the indium 31 in a vapor phase. The process is allowed to proceed until approximately 1000 angstroms or less of thickness is developed in the zinc telluride layer which becomes the first, or primary, growth matrix.

The dimethyl zinc for the first cycle is stored at 0° C. under 127.4 mm pressure. The dimethyl tellurium is also stored at 0° C. under 13.8 mm pressure.

The dimethyl cadmium is stored as a liquid in a source container at 0° C. under 9.7 mm pressure. The di-isopropyl tellurium is stored at 32° C. under 5.6 mm pressure. These liquids are selectively all carried to inlet 17 by carrier gas hydrogen at 1 atmosphere ambient from their sources in conventional carrier gas manner.

Then, the input materials to inlet 17 are changed so that a layer of cadmium telluride 103 (FIG. 12) is grown over the zinc telluride 101 with the indium dopant attaching to the primary matrix 101 and being deposited during the growth of the cadmium telluride 103. To accomplish this step, dimethyl cadmium and dimethyl tellurium are the materials entered into inlet 17 so that reactive species are developed and indium is transported during the growing of the cadmium telluride layer, again by the methyl radicals, to provide doping during this processing step.

The final step involves alternately growing a thin layer of cadmium telluride, approximately 230 angstroms and stopping the process, and then, growing a thin layer of mercury telluride of approximately 770 angstroms, and then stopping the process and reverting to the growing of a thin layer of cadmium telluride. This alternate processing is repeated for perhaps 100 times, or until the mercury cadmium telluride layer reaches approximately 10 microns in thickness. The period of cadmium telluride growth is approximately 30 to 40 seconds and the period of mercury cadmium telluride is approximately 40 to 60 seconds with these alternate cycles being continued until the desired thickness of the mercury cadmium telluride layer is obtained. After growth is terminated, the structure is annealed at 400° C. for 10–30 minutes to interdiffuse the growth constituents for complete homogenization of the material.

The materials for these interdiffused steps comprise di-isopropyl tellurium, and elemental mercury through which the di-isopropyl tellurium is flowed at a temperature of about 220° C. outside of the reactor so that the combination is introduced into inlet 17. Dimethyl cadmium is also introduced into inlet 17 to provide the cadmium for combination with the other elements for developing the ternary semiconductor mercury cadmium telluride.

Purging is carried out between each layer growth cycle by flushing with hydrogen gas for about 10 seconds.

The forgoing is also a good method in accordance with the invention, because the transport of the dopant is most likely via methyl radical exchange with the dopant source indium. Some radical exchange may occur with ethyl radicals and in lesser amounts with higher alkyls, i.e., isopropyl.

Dimethyl mercury could also be used as a source of free methyl radicals.

The preferred flow rates for the reactor vessel 15 depend on the size of the vessel in use but to a first approximation should scale with cross sectional area normal to the direction of flow. Thus, for a 10 cm$^2$ cross section typical flows are as follows:

HgTe cycle: di-isopropyl tellurium (500 cc/min through the bubbler @27°)
 hydrogen dilution (2.5 liter/min.)
CdTe cycle: dimethyl cadmium (30 cc/min through the bubbler @0° C.)
 dimethyl tellurium (20 cc/min through the bubbler @0° C.)
 hydrogen dilution (3 liter/min).

The flows and temperatures of these gases can change in order to vary the binary growth rates (mercury telluride or cadmium telluride) or to alter the stoichiometric ratio. Most of the transport occurs during the cadmium telluride cycle when there is an abundant source of free methyl radicals. However, indium incorporates more efficiently into mercury telluride, so the incorporation rate peaks at the mercury telluride or cadmium telluride interface. The flow of the methyl containing precursors, e.g., organometallic compounds present, will alter the transport rate of dopant to the epi-layer, as will the number of interdiffused multilayer process interfaces. The direction of flow is normally from the source to the substrate, as shown by the arrows in FIGS. 1 and 2.

The pressure in the reactor vessel 15 is typically one atmosphere (total pressure) or slightly above (10%). However, this doping technique could be used with reduced pressure operation down to approximately 0.1 atmosphere. The lowest pressure for mercury cadmium telluride growth by MOCVD reported in the literature is 0.5 atmospheres (lower pressures are impractical because of the difficulties in maintaining mercury pressure).

MOCVD is not typically done above 1 atmosphere because it is carried out in hydrogen and the risk of leakage and consequential explosion is too great. However, under some circumstances it may be advantageous to risk higher pressures.

Rotation of the substrate 27 is realized by an external motor (not shown), connected to a drive shaft which enters the reactor 15 via an O-ring seal. This shaft couples with a turnable insert 25 in the susceptor 21 made of graphite. Rotation speeds are on the order of 5 rotations per minute.

The RF heating circuit for the susceptor graphite block 21 uses a Eurotherm temperature controller with a chrome alumel thermocouple placed in a re-entrant quartz tube in the center of the graphite susceptor 21. The typical temperature profile along the axial direction of flow, on the top surface of the substrate/susceptor is indicated in FIG. 3. The control thermocouple indicated 400° C. throughout the collection of data for the chart of FIG. 3. The heat is mainly transferred by conduction along the graphite block 21 from the substrate 27 region to the indium 31 region.

Two types of indium target have been used for free radical doping. The first comprises evaporated indium dots 10 micrometers thick, and the other, sections of indium wire, typically 0.2 mg in weight. The dots have a higher surface area to volume ratio than the wire source and characteristically show high concentrations at the start of growth, depleting towards the end. The diameter of the dots is a function of mass. For a 0.1 mg mass, a 0.012 inch diameter sphere is used. For a 0.2 mg mass 0.015 inch sphere is used, and for 0.3 mg mass, a 0.017 inch diameter sphere may be used. These spheres may be commercially purchased. The diameter of the indium wire used was 0.015 inches.

Either type of dopant source may be selected to be mounted on graphite blocks 21 or 21', adjacent to the substrate such as gallium arsenide or sapphire, shown at 27. Once the size and weight of the indium source 31 are chosen, the concentration of indium in the epitaxial layer is governed by the source temperature, methyl concentrations, interdiffused multilayer process frequency and substrate temperature.

Since each piece of equipment is different from any other piece of equipment, some adjustments in the amounts of input quantities may be necessary. However, as a guide to setting the estimated or general figures, the molar ratio of cadmium to telluride is between 1.5 and 2 to 1. This is the concentration measure of the input materials. The zinc to tellurium ratio is between 0.5 and 2 to 1. The dimethyl telluride to mercury molar ratio is 0.0048, dimethyl cadmium to mercury is 0.0072. di-isopropyl to mercury is 0.04, and the actual molar amounts of mercury injected is approximately 0.003 moles/min.

The indium source is liquid at the preferred temperature of 400° C. to provide reaction with the input alkyls. Lowering of the melting point of a dopant indium source can be achieved by using a eutectic alloy. The other alloy component must be electrically inert in the epitaxial layer or not react to form volatile products with the input gas stream.

GALLIUM ARSENIDE, ZINC DOPED

In a further example, the way to make zinc doped gallium arsenide is to supply the materials listed below to the inlet 17 (FIG. 1) for entering the reactor vessel:

trimethylgallium
arsine gas
hydrogen gas

Also, elemental zinc 31 would be located on the susceptor 21.

Arsine gas would be introduced into the reactor chamber 15 at room temperature, and at a flow rate of approximately 50 cubic centimeters per minute (cc/min) in a reducing atmosphere of hydrogen gas which is flowing at six liters per minute, and the susceptor 21 would be gradually heated to a nominal growth temperature of 625 degrees centigrade. Following temperature stabilization, trimethylgallium would be injected into the growth chamber 15 at a flow rate of approximately 10 cc/min through the reactant gas inlet 17. At this point, growth would be initiated and continue for a prescribed length of time, which is determined by the target thickness for the gallium-arsenide layer to be grown (e.g., 2 hours for approximately 2 microns of material). It is during this growth period that the trimethylgallium precursor would decompose and liberate free methyl-radicals which subsequently react with the transport the elemental zinc dopant 31 as a reactive metalorganic species to the gallium-arsenide substrate 27. When the reactive species arrives at the growth surface 27, it would decompose and the active zinc dopant specie would be incorporated into the growing crystal lattice. Both the growth and doping processes are terminated by discontinuing the flow of trimethylgallium into the reactor 15. The zinc doped gallium-arsenide crystal 27 would then be allowed to cool in a mixture of arsine and hydrogen to approximately 400 degrees centigrade, at which time the arsine flow is discontinued. The crystal would then be allowed to cool to room temperature in the presence of hydrogen. After cooling, the zinc doped gallium-arsenide layer 27 would be removed from the reactor chamber 15, and would be useful for HBT device fabrication.

INDIUM PHOSPHIDE, BERYLLIUM DOPED

In still a further example the materials provided at the inlet 17 (FIG. 1) for entering into the reactor vessel 15 would be:

triethylindium
phosphine gas
hydrogen gas

Also, elemental beryllium 31 would be located on the susceptor 21.

In this example, phosphine gas was introduced into the reactor chamber 15 at room temperature, and at a flow rate of approximately 500 cubic centimeters per minute (cc/min) in a reducing atmosphere of hydrogen gas which would flow at six liters per minute, and the susceptor 21 is gradually heated to a nominal growth temperature of 650 degrees centigrade. Following temperature stabilization, triethylindium would be injected into the growth chamber 15 at a flow rate of approximately 1000 cc/min through the reactant gas inlet 17. At this point, growth would be initiated and continue for a prescribed length of time, which would be determined by the target thickness for the indium-phosphide layer to be grown (e.g., 4 hours for approximately 2 microns of material). It is during this growth period that the triethylindium precursor would decompose and liberate free ethyl-radicals which subsequently would react with and transport the elemental beryllium dopant 31 as a reactive metalorganic species to the indium-phosphide substrate 27. When the reactive species arrives at the growth surface 27, it would decompose and the active beryllium dopant specie would be incorporated into the growing crystal lattice. Both the growth and doping processes are terminated by discontinuing the flow of triethylindium into the reactor 15. The beryllium doped indium phosphide crystal 27 would then be allowed to cool in a mixture of phosphine and hydrogen to approximately 25 degrees centigrade, at which time the phosphine flow would be discontinued. After cooling, the beryllium doped indium-phosphide layer 27 would be removed from the reactor chamber 15, and would be useful for opto-electronic device fabrication.

In summary, some of the rules regarding the expected electrical type of dopants are, (a) for II-VI materials such as MCT, CdTe, ZnTe, ZnS, ZnSe etc.:

group III dopants such as indium and gallium, are donors (n-type)
group V dopants such as arsenic and phosphorus are acceptors (p-type)
group I dopants are acceptors
group VII dopants are donors.

For III-V semiconductors such as gallium arsenide. indium phosphide, indium antimonide etc.:

group II dopants are acceptors.
group IV dopants such as silicon are usually donors.
group VI dopants are donors.

The main group I-VII are preferred dopants imparting N or P to the crystal under growth. Transition elements and lanthanides usually do not provide P and N doping but rather erase or eradicate semiconducting behavior infra semi-insulating behavior.

Transition elements and/or lanthanides are used to impart a degree of semi-insulating dopant character to a semiconductor, e.g., iron or cobalt included in a growing layer of indium phosphide will typically impart a semi-insulating character to the extent of resistivities of $10^5$ to $10^9$ ohm-centimeter, as is well known.

Susceptor doping could be applied to the above list either introducing the dopant as the element or as a suitable alloy. For uniform doping, the source is preferably a liquid at temperature, which will influence choice of the source, temperature, and amount of the dopant target. Dopants which are solids at temperature may be used as well.

The semiconductor material(s) may be single materials, such as silicon and germanium or a combination of elements from both the main groups I-VII and from transitional series elements.

The organic free radical carriers preferably include aliphatics of both saturated and unsaturated types. The saturated aliphatics come within the formula $C_NH_{(2N+1)}$., e.g., $CH_3$-$CH_2$. known as alkyl radicals, and the unsaturated aliphatics use the formula $C_NH_{(2N-1)}$., e.g., $CH_2$=CH-$CH_2$. These are unsaturated alkyl radicals. Thus, one could use alkyl radicals having up to generally no more than 6 carbon atoms, or unsaturated alkyl radicals having from 1-6 carbon atoms, and not less than 2 carbon atoms.

One skilled in the art approaching a new situation would normally read the specification for the electrical properties required in the new/old semiconductor materials.

He would then define the materials to carry out the synthesis by MOCVD.

Based on properties of these precursors. and knowing the given electrical properties of the specification, he can select a suitable temperature range for the operating temperature. This temperature usually will be between 200 and 800° C. except for silicon which usually requires 1000 to 1200° C. operating temperatures.

It is conceivable that the crystal growing temperature is not compatible with sustaining the dopant chosen, in which case a separate doping temperature is chosen by heat independently controlled in the apparatus. Thus, the apparatus simply uses graphite zones with different temperatures.

Since mercury is a liquid at room temperature and boils at 357° C. it isn't feasible for use as a dopant source in a 500° C. chamber. Therefore, a discrete heating zone would be necessary. The opposite conditions for sources which, for example, are solid below 1000° C. temperatures may be similarly solved.

Highly reactive aliphatic radicals may be chosen for transporting relatively unreactive elements at the operating temperature or vice versa.

Generally, high purity materials are grown at lower temperatures and less pure materials are grown at higher temperatures typically resulting in higher growth rate processing.

The vapor pressure of the dopant material for a selected temperature is a guide-line for the chemical potential of the element, and influences its chemical reactivity with free-radicals. Therefore, higher vapor pressures will result on higher concentrations at the dopant species in the gas phase.

Figure 10:
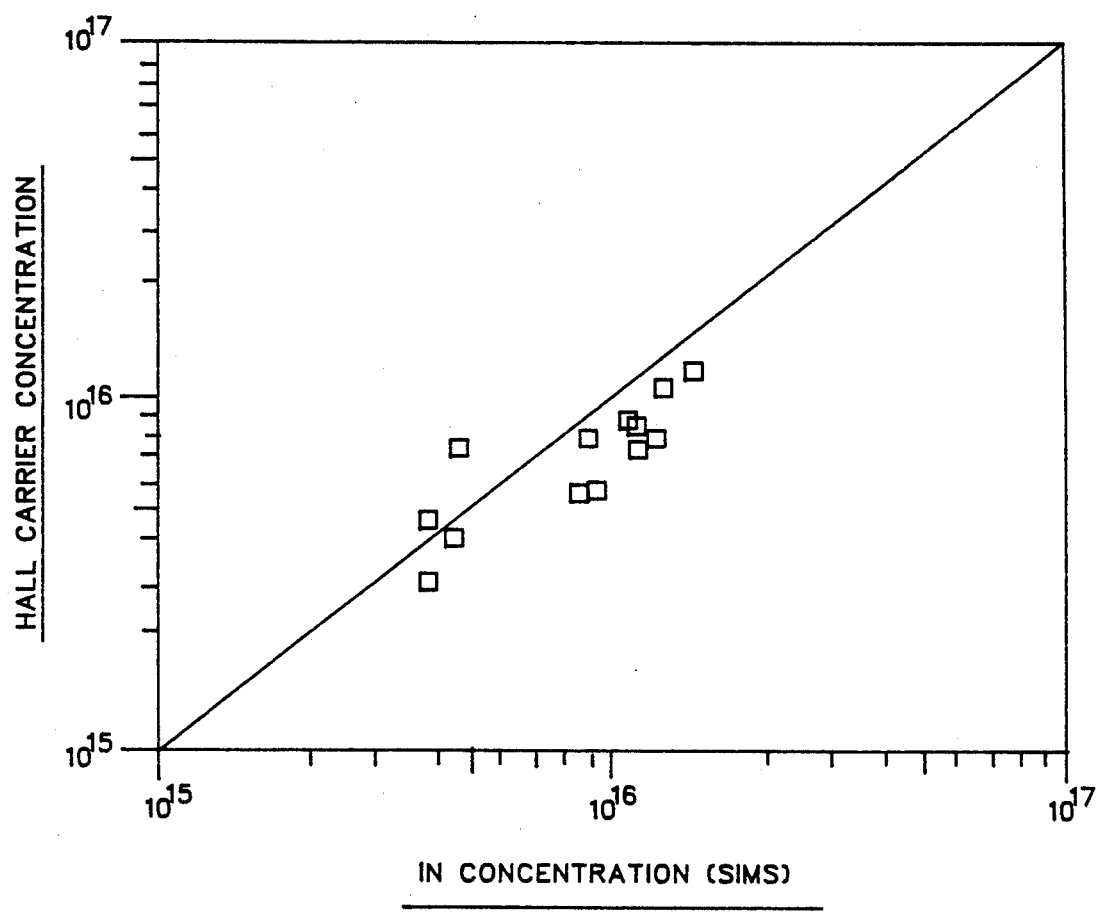
FIG. 10 is a plot of Hall carrier concentration, which is the net N type electron concentration due to indium, 100% activation of the species as an n-type donor dopant.

FIGS. 4-9 show the doping concentration for a series of indium doped mercury cadmium telluride material layers using this configuration. In this series, the reproducibility and control of the indium dopant concentrations is excellent, and is better than has been demonstrated with any other known technique. These figures show typical Secondary Ion Mass Spectroscopy (SIMS) sputter depth profiles of the indium doping concentrations. These are all graphs of the samples of the same wafer, spaced at the specified locations. These profiles indicate that the dopant species is very uniform with depth, and also has outstanding spatial uniformity. In FIG. 10, the chart shows that the donor concentration is controlled by the indium dopant. The correlation between the Hall carrier concentration in atoms per cubic centimeter and the indium concentration (SIMS) in atoms per cubic centimeter is very good, and proves that the carrier concentration is being controlled by the intended dopant.

Figure 11:
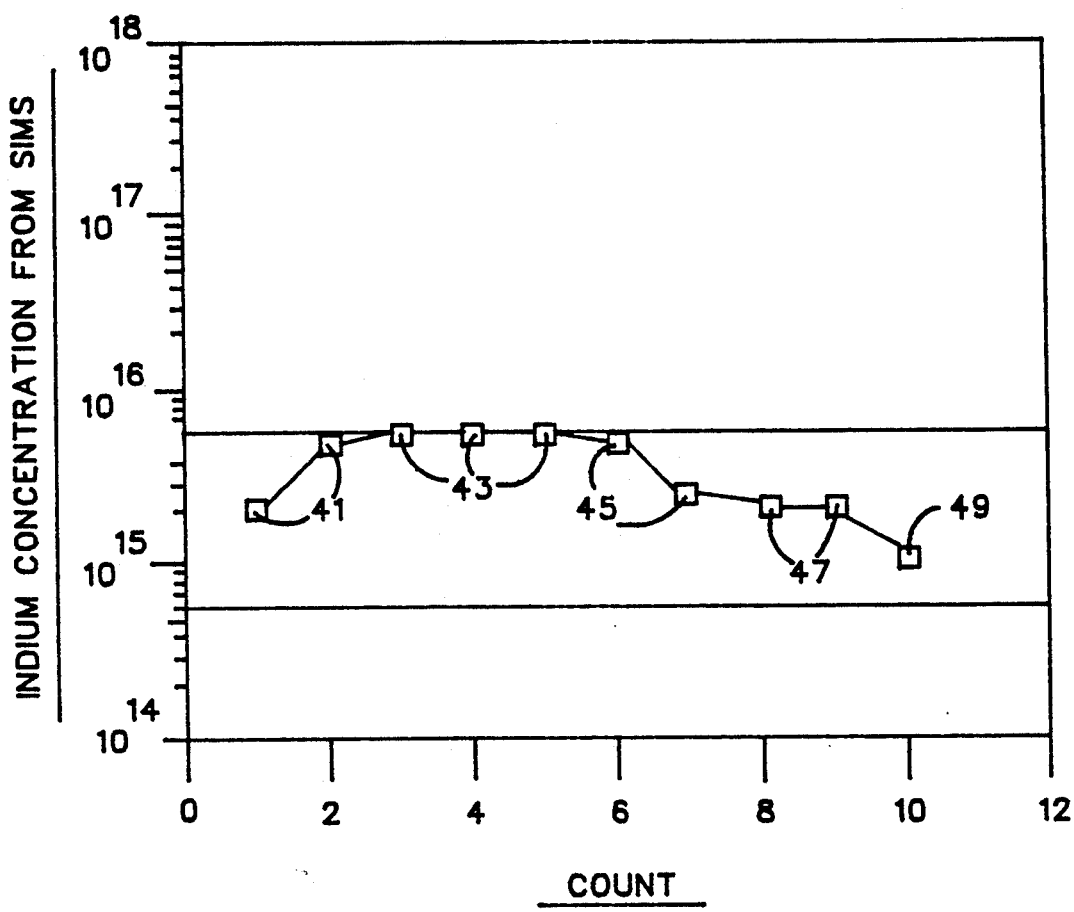
FIG. 11 shows a consecutive series of indium doped wafers, in different runs, to show the precision and reproducibility of this technique, and illustrates controllability following intentional dopant flux reduction.

In FIG. 11, in a different run from the wafers of the prior figures, the chart is provided to show that the indium concentration targeting is precise and highly reproducible. For example, the first two data bits on the left, shown at 41, indicate that the target level is being calibrated. The next three bits of data 43 show that the indium level is precisely maintained once the calibration is determined, and can be reproducibly accomplished.

The data shown at 45 indicates that the indium level can be intentionally reduced, as is proven by the chart. The data shown at 47 shows that the indium level can be stabilized at a lower level. And the data shown at 49 indicates that the doping level can be further reduced, in this case into the $10^{14}$ atom/cm$^3$ range.

Thus, in general, while a working temperature of approximately 400° C. is given in the preferred example, usually temperatures in the range of 300°-500° C. may be employed as the operating temperatures. It should be noted that the flux or the concentration of the dopant which is transported is a function of the amount of methyl radicals, the temperature of the dopant source, and the radical type (i.e., the higher the alkyl, the lower the dopant concentration, because fewer indium atoms will be transported). The range of doping from $10^{13}$ to $10^{18}$ can be covered by using the heavier radicals such as tertiary-butyl down to the lighter radicals of methyl.

It should now be realized that elemental indium may be used as a doping species whereas heretofore it must have been included in at least a volatile compound to provide even non-reproducible doping at low concentrations. Thus, the vapor phase technology herein disclosed is the very cutting edge for free radical transport of the dopant species.

While matrix elements may have been transported for the primary growth matrix, they make up the compound semiconductor, but they do not control the electrical properties of the semiconductor which add electrons or leave holes to accept electrons in the form of the dopant species. Thus, the amount of metalorganics is not critical.

It should be emphasized that the subject method provides reproducible doping in MOCVD processing. In other words, the transport of. e.g., the indium is by virtue of the reactive indium-alkyl which is formed in the reactor, and exists in the form of a gas which is flowing in the reactor system.

All of the prior art citations (supra) are hereby incorporated into this disclosure by reference.

It should be understood that conventional controlled heating of many types may be used to heat block 21 or blocks 21, 21'. Also, the blocks may be pyrolitic boron-nitride or molybdenum.

Heating elements may comprise infrared sources, heat from laser beams, other electrical resistance circuits, microwave or RF type, radiant heating from infrared lamps, or other appropriate heating sources where the graphite, pyrolitic boron-nitride, molybdenum or other materials can be used as a black body susceptor.

While a preferred method of practicing the invention has been set forth, it should be apparent that many other embodiments of the invention can be made using the principles taught herein, and accordingly, the invention is intended to be limited only by the attached claims wherein:

What is claimed is:

1. A method for precisely and reproducibly establishing predetermined levels of dopant species in a semiconductor material being formed by chemical vapor deposition, comprising the steps of:

heating a source of dopant species in a chamber;

locating a substrate in the chamber for heating in spaced apart relation to said source;

introducing into said chamber an organic gas mixture characterized by:

1. being a precursor to a semiconductor material to be deposited on said substrate, and
2. being a precursor to free organic radicals combinable with the dopant species for transport to the substrate.

2. The method of claim 1, wherein:
said semiconductor organic gas mixture combines a plurality of semiconductor constituent gases, each semiconductor constituent gas including a constituent of a multiple element semiconductor.

3. The method of claim 2, wherein:
the multiple element semiconductor is gallium arsenide.

4. The method of claim 2, wherein:
the multiple element semiconductor is indium phosphide.

5. The method of claim 2, wherein:
the multiple element semiconductor is mercury cadmium telluride, and
the dopant species is one of:
transition elements, an element selected from Group I, II, IV, V, VI, VII, and boron, aluminum, and gallium.

6. A method for precisely and reproducibly establishing predetermined levels of dopant species in a semiconductor material being formed by metalorganic chemical vapor deposition, comprising the steps of:
heating a source of dopant species in a chamber;
locating a substrate in the chamber for heating in spaced apart relation to said source;
introducing into said chamber metalorganic gas characterized by:
1. being a precursor to a semiconductor material to be deposited on said substrate, and
2. being a precursor to free organic radicals which are combinable with the dopant species for transport to the substrate.

7. The method of claim 6, wherein:
said metalorganic gas is a semiconductor organic gas.

8. The method of claim 7, wherein:
said semiconductor organic gas combines a plurality of semiconductor constituent gases, each semiconductor constituent gas including a constituent of a multiple element semiconductor.

9. The method of claim 7, wherein:
the multiple element semiconductor is gallium arsenide.

10. The method of claim 7, wherein:
the multiple element semiconductor is indium phosphide.

11. The method of claim 7, wherein:
the multiple element semiconductor is mercury cadmium telluride, and
the dopant species is one of:
transition elements, an element selected from Group I, II, IV, V, VI, VII, and boron, aluminum, and gallium.

12. A method for precisely and reproducibly establishing predetermined levels of dopant species in semiconductor materials, comprising the steps of:
heating a source of dopant in a chamber; introducing gas comprising aliphatic radicals and metal organic precursors for reaction therein to form semiconductors, and, transporting dopant species from the source by free radical transport to the semiconductor material being formed.

13. The method of claim 12 wherein:
said gas comprising aliphatic radicals includes any possible combination of metalorganics, which either in combination or individually can be used to form semiconductor materials.

14. The method of claim 12 wherein:
said source of dopant includes any element or alloy which can be transported by free aliphatic radicals for doping in said semiconductor materials.

15. The method of claim 12, wherein:
the gas further comprises metalorganic molecules.

16. A method for precisely and reproducibly establishing predetermined levels of dopant species in both II-VI and III-V semiconductor materials, comprising the steps of:
heating a source of dopant in a chamber; introducing gas comprising aliphatic radicals and metal organic precursors for reaction therein to form either II-VI or III-V semiconductors, and, transporting dopant species from the source by free radical transport to the semiconductor material being formed.

17. The method of claim 16 wherein:
said gas comprising aliphatic radicals includes any possible combination of metalorganics, which either in combination or individually can be used to form semiconductor materials.

18. The method of claim 16 wherein:
said source of dopant includes any element or alloy which can be transported by free aliphatic radicals for doping in said II-VI or III-VI semiconductor materials.

19. The method of claim 16, wherein:
the gas further comprises metalorganic molecules.

20. A method of forming a doped semiconductor material on a heated substrate using metalorganic chemical vapor deposition techniques which comprises:
providing a heated target of metal dopant in a chamber proximate the substrate on which said semiconductor is being deposited; and,
feeding to said chamber a mixture of metalorganic gases in a carrier gas under conditions which will create gaseous metalorganic species of said metal dopant for transport of the metal dopant to said semiconductor material as it is deposited.

21. The method of claim 20, wherein:
said substrate is gallium arsenide having a crystallographic orientation $<100>10°\rightarrow<110>$.

22. The method of claim 20, wherein:
the substrate and the dopant are heated to temperatures in the range 200°–800° C.

23. The method of claim 20, wherein:
the doped semiconductor material formed is beryllium doped indium phosphide; and,
the metalorganic gases comprise triethylindium, and phosphine in a carrier of hydrogen gas.

24. The method of claim 22, wherein:
the doped semiconductor material is zinc doped gallium arsenide, and,
the metal organic gases comprise trimethylgallium, and arsine gas in a carrier of hydrogen gas.

25. The method of preparing a doped semiconductor material using metalorganic chemical vapor deposition techniques which comprises:
placing in proximity to a heated substrate where the semiconductor material is being formed, a source of heated dopant material, and,
carrying out the semiconductor formation under conditions which generate gaseous metalorganic species of the dopant for transport to the semiconductor substrate being formed.

26. A method for precisely and reproducibly establishing predetermined levels of dopant species in a semiconductor material being formed by chemical vapor deposition processing, comprising the steps of:
heating a source of dopant species in a chamber;
locating a substrate in the chamber in spaced apart relation to said source and heating said substrate;
introducing into said chamber a gaseous stream feed which contains a precursor to the semiconductor to be deposited and a source of organic material which will combine with the dopant species for transport of the dopant to the substrate.

27. The method of claim 26 comprising the steps of:
independently heating the substrate and the source wherein the gaseous feed includes components to form a multiple semiconductor by metal organic chemical vapor deposition techniques.

28. The method of claim 26 wherein:
the gaseous stream includes elements for forming gallium arsenide.

29. The method of claim 26, wherein:
the gaseous feeds includes elements for forming indium phosphide.

30. The method of claim 26, wherein:
the gaseous feeds includes elements for forming mercury cadmium telluride.

31. The method of claim 28, wherein:
the dopant species is zinc.

32. The method of claim 29, wherein:
the dopant species is beryllium.

33. A method for precisely and reproducibly establishing predetermined levels of dopant species in a semiconductor material being formed by metalorganic chemical vapor deposition comprising the steps of:
heating a source of dopant species in a chamber;
locating a substrate in the chamber in spaced apart relation to said source and heating the substrate;
introducing into said chamber metalorganic gas which comprises:
1) a precursor for forming the semiconductor material to be deposited on said substrate using metalorganic chemical vapor deposition and;
2) a source of free organic radicals which are combinable with the dopant species for transport to the substrate of the dopant.

34. The method of claim 33, wherein:
the dopant concentration transported to the semiconductor material on the substrate is controlled by varying the mass of dopant species.

35. The method of claim 33, wherein:
the dopant concentration transported to the semiconductor material on the substrate is controlled by varying the heat of the dopant source.

36. The method of claim 33, wherein:
the dopant concentration transported to the semiconductor material on the substrate is controlled by varying the concentration of organic free radicals in the metalorganic gas for transport.

* * * * *